United States Patent [19]
Shifflet
[11] 4,382,235
[45] May 3, 1983

[54] SIMULATED NOISE GENERATOR

[75] Inventor: Glenn W. Shifflet, St. Louis Park, Minn.
[73] Assignee: International Control Systems, Inc., Golden Valley, Minn.

[21] Appl. No.: 224,260
[22] Filed: Jan. 12, 1981
[51] Int. Cl.³ ........................ F02P 15/00; H03B 29/00
[52] U.S. Cl. ........................................ 331/127; 331/78; 361/263
[58] Field of Search .................. 331/78, 127; 315/208, 315/241 S, 289; 361/253, 254, 255, 256, 257, 261, 263, 264, 265; 324/383

[56] References Cited

U.S. PATENT DOCUMENTS

| | | | |
|---|---|---|---|
| 3,551,800 | 12/1970 | Widmer | 324/383 |
| 3,900,768 | 8/1975 | Moriya | 361/263 |
| 4,064,450 | 12/1977 | Morales et al. | 324/383 |
| 4,280,166 | 7/1981 | Jesse et al. | 361/253 |

*Primary Examiner*—Siegfried H. Grimm
*Assistant Examiner*—Edward P. Westin
*Attorney, Agent, or Firm*—Orrin M. Haugen; Thomas J. Nikolai

[57] ABSTRACT

A test instrument for generating controlled bursts of electrical noise for use in testing the response of electronic equipment to such noise. A high voltage induction coil has its primary winding connected in circuit with a semiconductor switching means across a source of DC potential whereby when the current flow through the primary winding is interrupted, a relatively high voltage is developed across spark electrodes connected in the secondary winding of the coil and a spark discharge results. The spark discharge is, of course, rich in high frequency noise components which radiate therefrom to the system under test. The test instrument includes controls for causing the spark discharge to be generated either when triggered by a signal from the system under test, or by the manual operation of a push button switch, or at rates which may be varied by the operator. Also, when operating in the triggered mode, a desired phase delay may be introduced between the moment of triggering by the equipment under test and the time that the spark discharge is produced by the test instrument of the present invention.

7 Claims, 5 Drawing Figures

SIMULATED NOISE GENERATOR

BACKGROUND OF THE INVENTION

I. Field of the Invention

This invention relates generally to electronic test apparatus, and more specifically to a new and improved instrument for generating electrical noise under controlled conditions whereby electronic equipment may be evaluated in terms of its immunity to such generated noise.

II. Discussion of the Prior Art

It is well known that various electrical and electronic systems will fail or otherwise render faulty performance when subjected to electromagnetic interference (EMI). Thus, manufacturers of such equipment attempt to determine their product's immunity to EMI as a necessary adjunct to the design, development, manufacture and testing of such electronic products. Through proper component selection, shielding, circuit layout and compensating techniques, it is possible to avoid, in most instances, the deleterious effects of EMI at predetermined energy levels.

The present invention is related to a test instrument useful in evaluating an electronic system's performance and/or vulnerability to EMI or noise. Specifically, the present invention is directed to a "noise generator" which involves a variety of control parameters whereby the energy content of the emitted noise pulses as well as the burst frequencies and occurrences can be selectively controlled to thereby facilitate the measurements of response characteristics of the equipment under test to the noise bursts so generated.

SUMMARY OF THE INVENTION

The noise generator of the present invention comprises a spark discharge device which is arranged to be under operator control such that the power output, triggering rate and time of application of a noise burst can be determined. The spark discharge device includes an induction coil having a primary winding which is connected in series circuit with a power supply and a semiconductor switch and a secondary winding coupled to spark gap electrodes. When the semmiconductor switching device is on, a current flows through the primary winding and when the semiconductor switching device is then turned off, a large voltage is induced across the coil's secondary winding sufficient to create a spark breakdown between the electrodes defining the spark gap. As is well known in the art, a spark discharge is rich in high frequency components which radiate as noise to the surrounding environment.

The turning on and off of the semiconductor switches in the primary circuit of the induction coil is governed by further control circuits so that the firing of the spark discharge may be triggered by the equipment being tested, triggered by a push button depression, or made to trigger in a free-running mode at a rate which is variable over a predetermined range. When the noise generator is operating in its triggered mode, the triggering signals are applied to the instrument by the equipment under test through a fiber-optic coupler, thus rendering the instrument immune from self-induced noise. Furthermore, the amplitude of the noise bursts is controllable. In addition, when the triggering of the noise burst is under control of a trigger signal provided by the equipment under test, the test instrument of the present invention provides a phase adjustment means whereby the time interval between the onset of the trigger signal from the equipment under test and the generation of the noise burst impulses may be adjusted.

OBJECTS

It is accordingly a principal object of the present invention to provide a new and improved electronic test instrument for generating controlled bursts of EMI or noise.

Another object of the invention is to provide a noise generator for use in testing of electronic equipment wherein the amplitude, rate and time of occurrence of a noise burst are selectable by the technician.

Yet another object of the invention is to provide a noise generator for use in evaluating electronic equipment and which can be made to operate in a variety of modes to thereby enhance its flexibility as a diagnostic instrument.

Still another object of the invention is to provide a test instrument to the type described which is portable and which may therefore be disposed physically at various locations relative to a piece of electronic equipment under test.

A still further object of the invention is to provide a noise generator type test instrument which, itself, is relatively immune in its operation from the noise signals which it generates.

These and other objects and advantages of the invention will become apparent to those skilled in the art from the following detailed description of a preferred embodiment when considered in conjunction with the accompanying drawings.

DESCRIPTION OF THE PREFERRED EMBODIMENT

Figure 1:
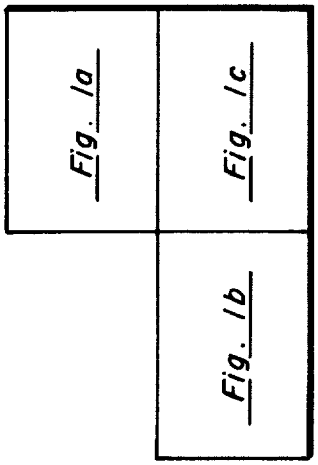
FIGS. 1*a*, 1*b* and 1*c*, when arranged as shown in FIG. 1, show an electrical schematic diagram of the preferred embodiment.
Figure 1A:
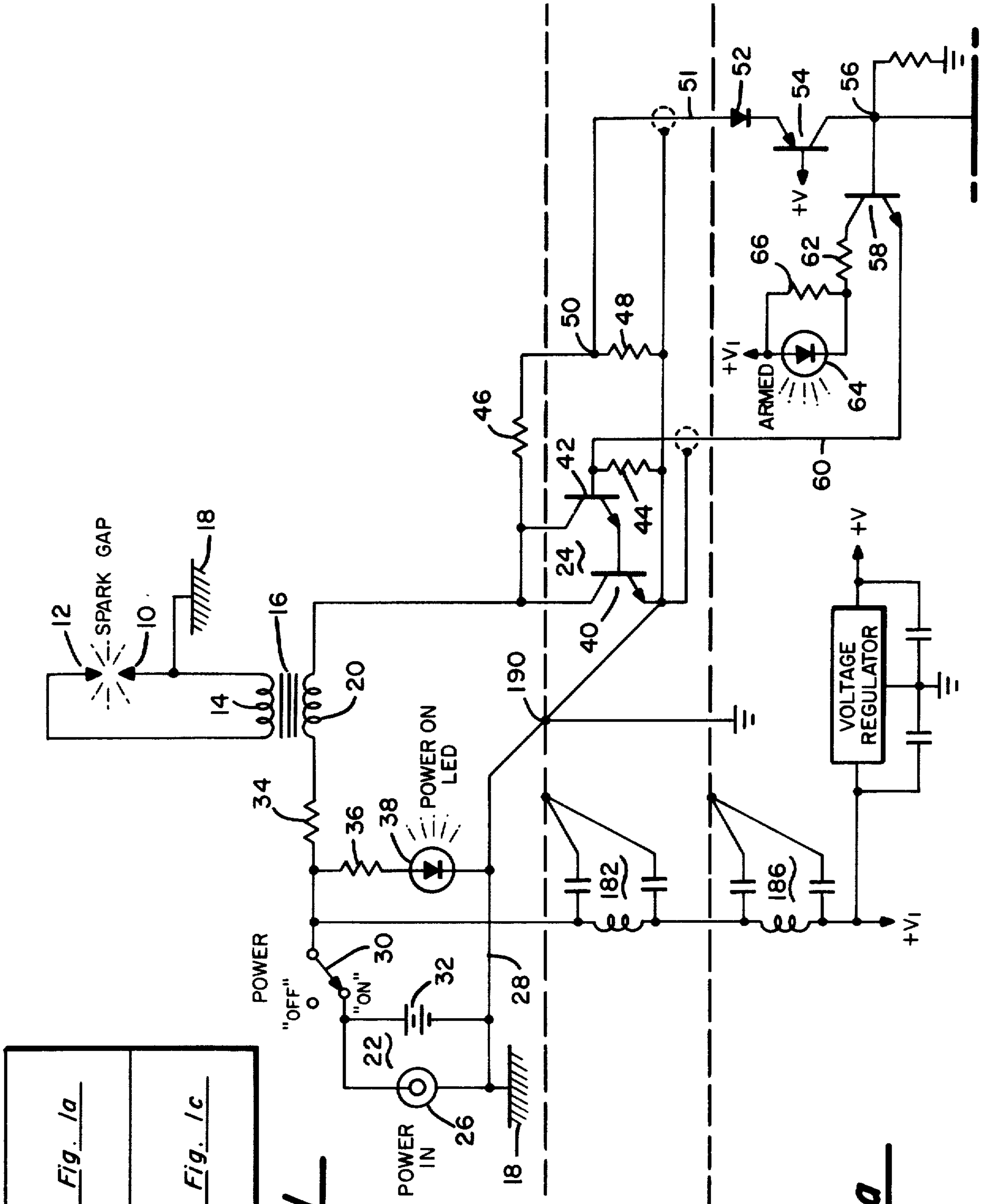

Referring now to FIG. 1*a*, the spark discharge noise generator comprises a pair of spaced apart electrodes 10 and 12 which are coupled across the secondary winding 14 of a high voltage induction coil 16. The electrodes 10 and 12 are spaced such that when a sufficiently high voltage is developed across the secondary winding 14, a spark breakdown will occur across the electrodes 10 and 12 to radiate EMI or noise. The electrode 10 is tied to the chassis ground as at 18.

The primary circuit for the induction coil 16 includes a primary winding 20 which is adapted to be coupled in a series circuit with a power supply indicated generally by numeral 22 and a semiconductor current control device indicated generally by numeral 24. More specifically, an input jack 26 is provided whereby the output from an AC-to-DC converter (not shown) may be connected. One side of the jack 26 is connected to a bus 28 tied to chassis ground and the other side of the jack is connected to the "on" side of a single pole, double throw on/off switch 30. Also connected between the ground bus 28 and the "on" terminal of the switch 30 is a DC power source which may take the form of a rechargeable battery 32. The pole of the switch 30 is coupled through a small ballast resistor 34 to a first terminal of the primary winding 20 of the induction coil 16. A series combination of a current limiting resistor 36 and a light emitting diode (LED) 38 is connected in parallel with the battery supply 32 when the on/off switch 30 is in its "on" position. Current flowing through this parallel branch causes the LED indicator 38 to glow and indicate the "on" condition.

The semiconductor current control means 24 may comprise any one of a number of semiconductor current switches and is here shown as a pair of Darlington coupled transistors 40 and 42 having their collector electrodes tied in common to the other terminal of the primary winding 20 of the induction coil 16. The emitter electrode of the transistor 40 is connected to the grounded bus 28 and the base electrode of the transistor 42 is coupled through a bias resistor 44 to this same grounded bus. The emitter electrode of the transistor 42 is connected directly to the base electrode of the transistor 40. A voltage divider, including resistors 46 and 48, is connected in parallel with the emitter-to-collector path of the transistor 40 and the common junction 50 between these last-mentioned resistors is coupled through a shielded conductor and a diode 52 to the emitter electrode of a PNP transistor 54. The base electrode of this last-mentioned transistor is adapted to be connected to a source of positive reference potential +V and the collector electrode thereof is connected to a junction 56.

Also connected to junction 56 is the base electrode of a further NPN transistor 58 whose emitter electrode is coupled by a shielded conductor 60 to the base or control electrode of the transistor 42. The collector electrode of the transistor 58 is coupled through a current limiting resistor 62 and a LED indicator 64 to a further source of DC potential $+V_1$. A resistor 66 is connected directly in parallel with the LED 64.

The turning on and off of the semiconductor current control means 24 is governed by a first one-shot circuit 68 which preferably comprises a positive edge triggered, resettable one-shot and may, for example, be commercially available Type 4538 integrated circuit. The true output, Q, of the one-shot 68 is coupled to the base electrode of a transistor 70 whose collector is adapted to be coupled to the DC voltage source +V and whose emitter electrode is coupled through a resistor 72 to a junction 74 which is tied by a conductor 76 to the junction point 56 common to the base electrode of the transistor 58. The complement output, $\overline{Q}$, of the one-shot 68 is connected by a conductor 78 to the A input of a still further Type 4538 integrated circuit monostable multivibrator 80. The Q output of the one-shot 80 is connected to the base electrode of a NPN transistor 82 whose emitter electrode is coupled through a resistor 84 to the aforementioned junction 74. The emitter electrode of the transistor 82 is also coupled through a resistor 86 to a common ground. The complement output of the one-shot 80 is connected by a conductor 88 back to its B input and, as such, the one-shot 80 is made to operate in a non-retriggerable mode.

The timing for the one-shots 68 and 80 are each controlled by the R-C timing circuits coupled to their respective $T_1$ and $T_2$ input terminals. With respect to the one-shot circuit 80, then, the resistor 90 and the capacitor 92 provide the time constant establishing the metastable interval for the one-shot 80.

The timing circuit for the one-shot 68 includes an adjustable potentiometer 94 connected in series with a fixed resistor 96 and a capacitor 98 between a voltage source +V and the $T_1$ terminal of the one-shot circuit 68. Connected directly in parallel with the aforementioned series circuit is a further series circuit including a resistor 100, a capacitor 102 and a resistor 104.

The timing input terminal $T_2$ of the one-shot circuit 68 is connected to a switch arm 106C of a multi-bank, multi-contact rotary mode-control switch 106. In the drawings, the switch arms 106A, 106B and 106C are coupled together so as to move in unison from contact to contact. That is to say, when the switch arm 106C is moved from its position abutting the contact a to the contact b, the corresponding switch arms 106A and 106B also move from their a to their b positions.

The junction between the resistor 100 and the capacitor 102 is brought out to the contact b of the switch bank 106C while the contacts a, c and d are tied in common to the junction point between the potentiometer 94 and the capacitor 98. Because of the manner in which the switch bank 106C is intercoupled with the RC timing elements and with the timing terminals $T_1$ and $T_2$ of the one-shot circuit 68, it is possible to selectively vary the metastable period of the one-shot circuit 68 depending upon the particular mode that the system is to operate in.

The switch arm 106B of the rotary mode-control switch is coupled to the reset input terminal $C_d$ of the one-shot 68. The switch arm 106A of the mode select rotary switch 106 is coupled to the A trigger input of the one-shot. Because of the coupling 108 between the $\overline{Q}$ output of the one-shot 68 and the B trigger input thereof, the one-shot circuit 68 is made to operate in its non-retriggerable mode.

Figure 1B:
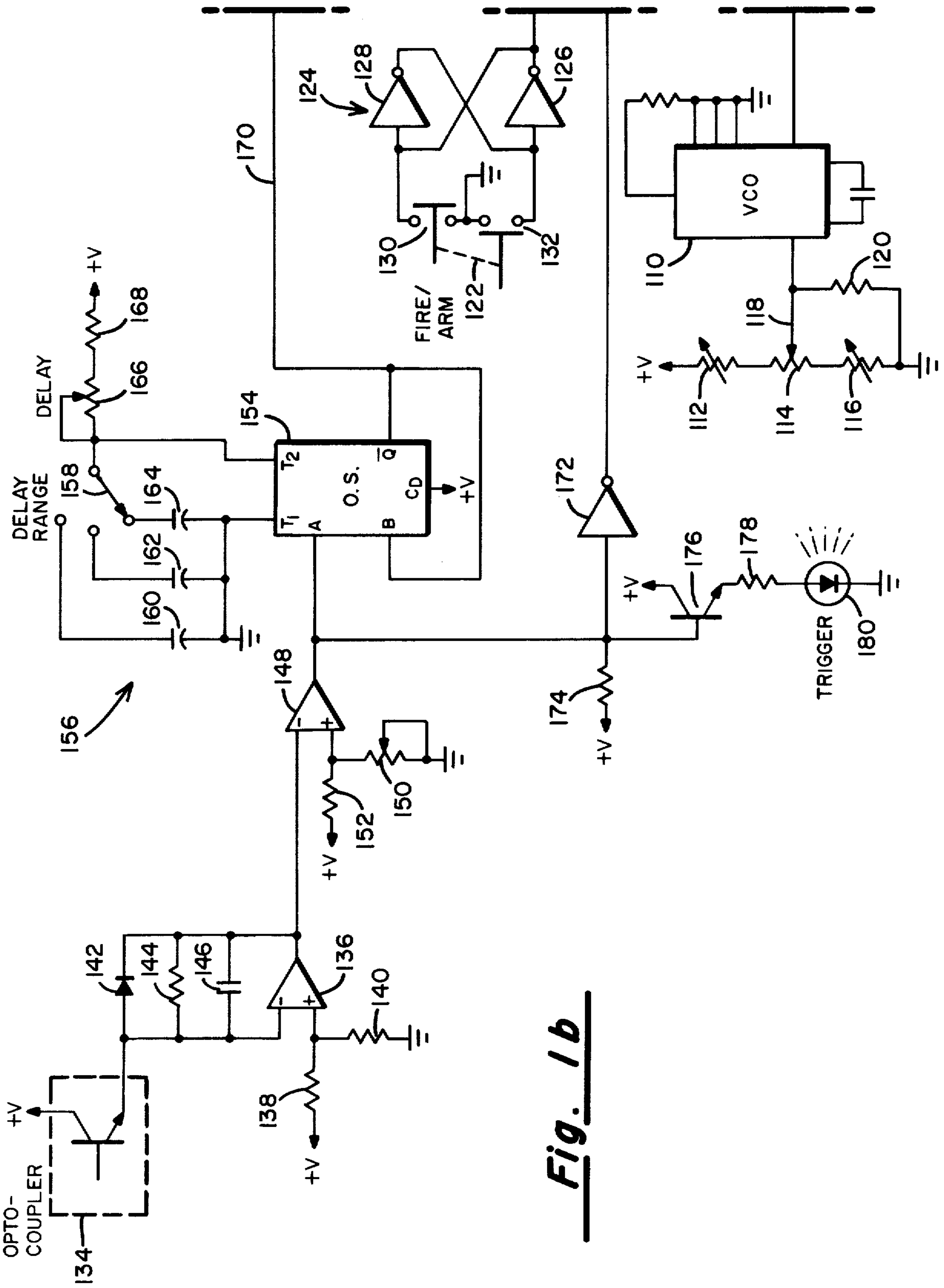
Figure 1C:
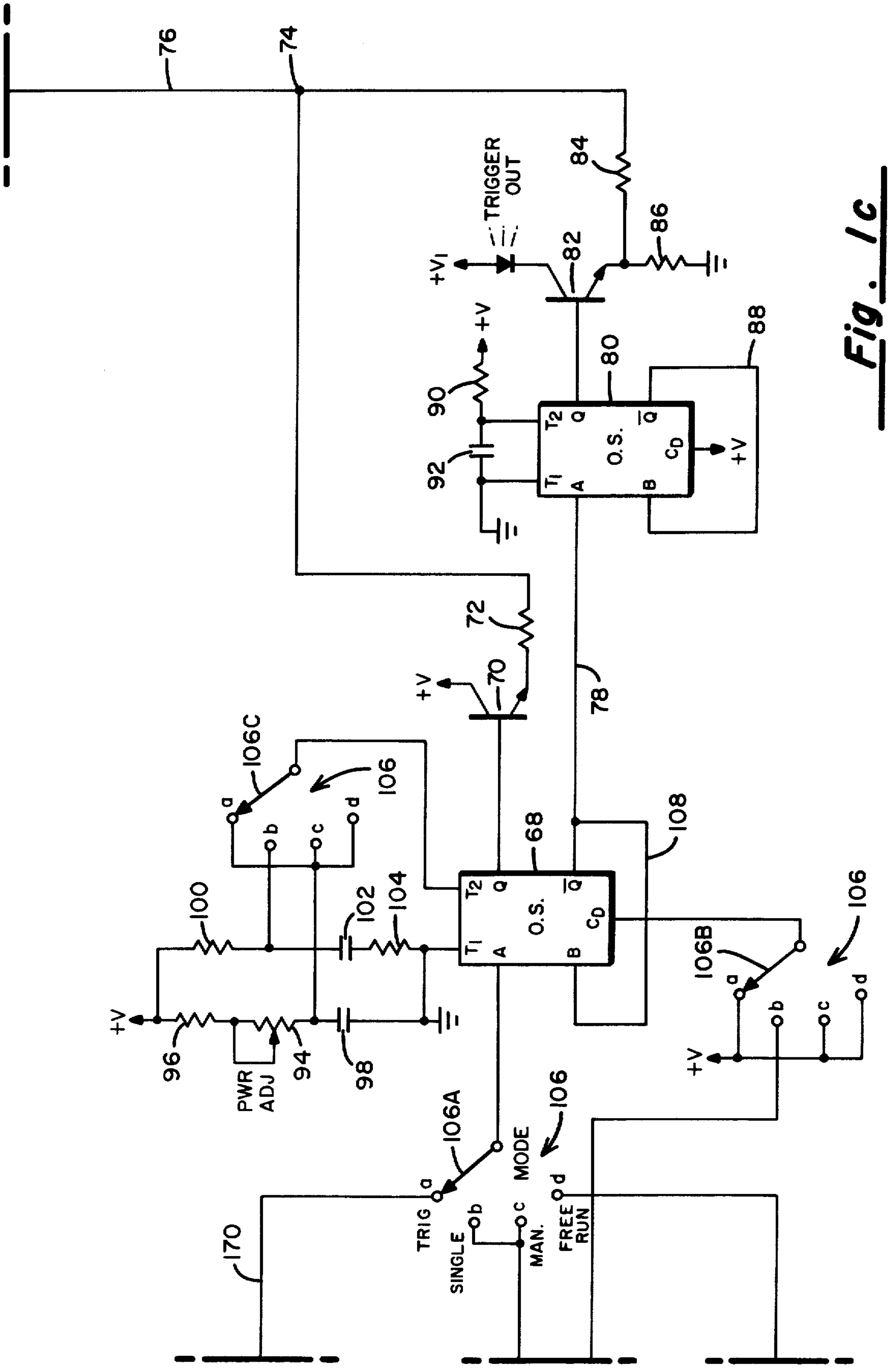

The four possible modes in which the circuit of the present invention may operate are respectively referred to as "Trigger," "Single," "Manual" and "Free-Run." These legends are illustrated in the drawing of FIG. 1c as being respectively associated with the contact positions, a, b, c and d.

When the system is operating in the Free-Run mode, then, the switch arms 106A, 106B and 106C each abut their respective (d) contact. The switch arm 106A will then convey trigger pulses from a voltage controlled oscillator 110 to the A trigger input of the one-shot circuit 68.

The voltage controlled oscillator 110 may comprise a Type 4046 integrated circuit which is a device which produces an output signal whose frequency is governed by the voltage applied to its input. Associated with the input of the VCO 110 is a resistive network including a series combination of a variable resistor 112, a potentiometer 114 and a further variable resistor 116. This series combination is connected between a source of voltage +V and a common ground. The wiper arm 118 of the potentiometer 114 is connected directly to the input of the VCO 110 and a further resistor 120 is connected between that same input and the common ground point.

When the switch arm 106A abuts its associated c contact and the system is operating in its "manual" mode, the trigger input A of the one-shot circuit 68 is adapted to be energized by a manually operable push button switch. Specifically, a push button switch 122 is coupled through a de-bounce circuit indicated generally by numeral 124 to the "manual" contact c of the mode control switch. The de-bounce circuit includes a pair of cross-coupled inverters 126 and 128. The push button switch 122 may comprise a set of normally closed contacts 130 and a set of normally open contacts 132 with one contact of each set being connected to a source of reference potential such as ground. When the push button is depressed, the normally closed contacts open and the normally open contacts close.

In testing certain electronic equipment, it is desirable that the electronic equipment itself provide a trigger signal to the noise generator of the present invention such that the time of occurrence of the noise burst is related to an event in the equipment under test. This is the so-called "triggered" mode.

With continued reference to FIG. 1*b*, the triggering signal from the external equipment under test is brought in on the control electrode of a NPN transistor 134 by way of a fiber-optic coupler (not shown). The collector of this electrode is adapted to be connected to the voltage source +V and the emitter electrode thereof is connected to the inverting input of an operational amplifier 136. Connected to the non-inverting input of that amplifier is a voltage divider including a resistor 138 and a resistor 140. Coupled as feedback elements from the output of the operational amplifier 136 back to its inverting inputs is a parallel combination of a diode 142, a resistor 144 and a capacitor 146.

The output from the amplifier 136 is coupled to the inverting input of a further operational amplifier 148 which is connected to function as a comparator. Connected to the non-inverting input of the comparator 148 is a resistive voltage divider including a potentiometer 150 and a fixed resistor 152. By varying the wiper arm on the potentiometer 150, the comparison threshold for the comparator 148 may be adjusted.

The output from the comparator 148 is applied to the trigger input terminal, A, of a further one-shot circuit 154 which may also comprise a Type 4538 IC positive edge triggered monostable multivibrator. The period of instability for the one-shot 154 is determined by the R-C timing circuit indicated generally by numeral 156 associated with the $T_1$ and $T_2$ input terminals of the one-shot. Specifically, the timing circuit includes a rotary switch 158 which may be used to couple any one of a plurality of capacitors such as capacitors 160, 162 and 164 in circuit with a variable resistor 166 and a fixed resistor 168. The connection from the $\overline{Q}$ output of the one-shot circuit 154 back to its "B" trigger input causes the one-shot circuit to operate in a non-retriggerable mode. The $\overline{Q}$ output from the flip-flop 154 is also coupled to the contact, a, of the mode control switch 106 by way of a conductor 170.

The output from the comparator 148 is also coupled through an inverter 172 through the b contact of the B bank of the mode control switch. When the switch arm 106B abuts the contact, b, a reset signal may be applied to the resettable one-shot circuit 68. A resistor 174 is coupled in series between a voltage source +V and the input to the inverter 172. The input to that inverter is also coupled to the base electrode of a NPN transistor 176 whose collector electrode is tied to the reference source +V and whose emitter is connected through a series combination of a current limiting resistor 178 and a light emitting diode (LED) 180 to the common ground point.

To preclude the noise bursts generated across the spark electrodes 10–12 from deleteriously affecting the operations of the controlling circuitry of the present invention, suitable shielding techniques are employed. Specifically, a low pass de-coupling filter 182 is coupled in circuit with the power "on" switch 30 and a metal can-type shield indicated schematically by the broken line 184. A similar decoupling filter 186 is employed to couple the same $+V_1$ bus to an inner shield which is indicated schematically by the broken line 188. The filters 182 and 186, being of the low-pass type, allow the DC voltage necessary for powering the control circuit to pass through the shields without introducing high frequency noise signals into the control circuitry by way of this bus. The can 184 is coupled to chassis ground by way of the ground bus 28 which connects to the can 184 at a junction point 190. This same junction point 190, then, comprises the common ground for the remainder of the circuit. It may also be noted that the outer shields of the shielded cables 60 and 51 which also pass through the inner shield 188 are tied to this common ground at the junction 190.

Before discussing the operation of the electronic circuitry thus far described, consideration will be given to the mechanical features of the noise generator of the present invention. In this regard, reference is made to FIG. 2 of the drawings. As is shown in FIG. 2, the electronic circuitry may be housed in a cabinet as at 192 having a front panel 194 on which are mounted the various controls.

Figure 2:
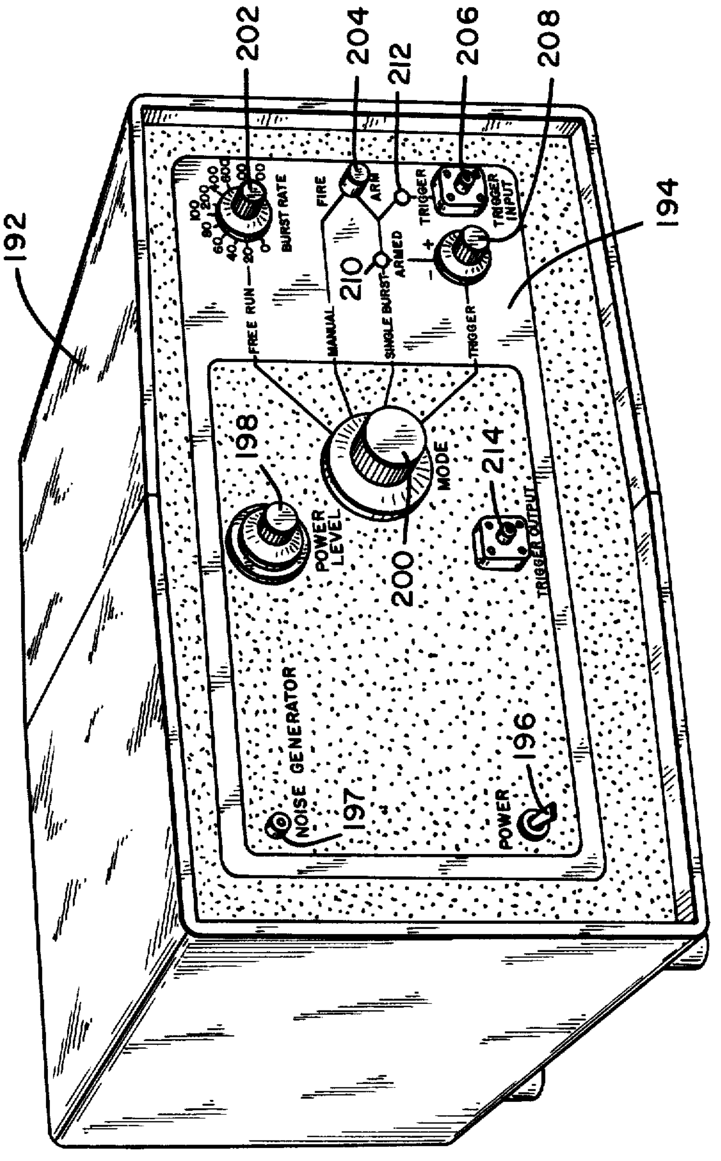
FIG. 2 is a perspective drawing of the cabinet in which the circuitry of the preferred embodiment may be enclosed.

The power "on/off" switch 30 of FIG. 1*a* is identified by numeral 196 in FIG. 2 and merely comprises a toggle switch of conventional design. The power adjust potentiometer 94 of FIG. 1*c* has a control knob 198 which may be rotated to adjust the resistor 94 from a minimum to a maximum value.

The rotary mode control switch 106 has its control knob 200 which may be set at any one of four positions labeled "Free-Run," "Manual," "Single Burst"and "Trigger." When set in its "Free-Run" position, a further knob 202 may be rotated to thereby adjust the positioning of the wiper arm of the potentiometer 114 in FIG. 1*b* whereby the frequency of noise pulse firing may be adjusted.

The "fire/arm" push button switches 122 in FIG. 1*b* are exposed through the front panel 194 of the cabinet at 204 to permit arming and firing of the noise burst. During the "arming" step current is allowed to flow through the primary winding 20 of the ignition coil for a sufficiently long time such that a relatively steady state condition prevails. After this time period, typically 20 seconds, has elasped, the primary circuit is abruptly interrupted creating a large inductive kick and a high voltage spark discharge occurs across the spark gap 10–12.

When the mode control switch 200 is moved to its "single burst" position, the firing of the spark discharge will be triggered by the external unit being tested, but only one such noise burst will be emitted. The trigger signal from the external equipment is preferably brought in via an opto-coupler (not shown) to the jack 206 on the front panel and a further rotatable control knob 208 is provided for adjusting the setting of the potentiometer 166 (FIG. 1*b*) which governs the phase delay between the onset of the triggering pulse from the external equipment being tested and the time at which the noise burst is generated. By using an optocoupler, the propensity of the device to self-trigger is eliminated.

The small circle labeled "armed" and identified by numeral 210 is an aperture in the front panel 194 through which the light emitting diode 64 (FIG. 1*a*) is exposed. Similarly, the small circle 212 comprises an aperture through which the light emitting diode 180 is exposed.

A "trigger output" jack 214 is also provided on the front panel 194 of the cabinet, allowing a fiber-optic conveyed signal to be taken from the "Trigger Out" of FIG. 1*c* LED and used to trigger an external oscilloscope (not shown) slightly in advance, e.g., by about 10 microseconds, of the noise burst. As such, the operator is able to observe the effect of the subsequent noise burst on the system under test without having the noise burst itself sporadically trigger the user's oscilloscope.

OPERATION

Now that the details of the construction of the preferred embodiment have been set forth, consideration will be given to its operation in the various available modes.

When the battery 32 is fully charged and the power "on/off" switch 30 is moved to its "on" position, a current flows through the resistor 36 and the LED 38 to signal the fact that the device is "on." As such, the indicator 197 (FIG. 2) will be glowing. Let it next be assumed that the Darlington coupled transistors 24 are conducting by virtue of a positive control signal being applied to the base electrode of the transistor 42. With the Darlington pair 24 conducting, then, a current flows from the battery source 32, through the switch 30, through the ballast resistor 34, the primary winding 20 of the induction coil 16, through the collector-to-emitter path of the transistor 40 and the ground bus 28 back to the battery supply. If this current flow has been established for a predetermined time, a steady state has been reached and no voltage is induced into the secondary winding 14 of the induction coil.

Now, if an event occurs which suddenly causes the Darlington coupled transistors 24 to cease conduction, a large rate of change of current occurs in the primary winding 20 of the induction coil and a substantial voltage is induced across the secondary winding 14, sufficient to break down the air in the gap between the spark electrodes 10 and 12. The resulting spark discharge causes RFI and EMI noise to radiate to surrounding areas and particularly to equipment being tested for its immunity to such noise bursts.

Next to be considered are the various ways in which the Darlington pair 24 may be switched from a conducting to a nonconducting state. First, let it be assumed that the mode control switch 106 is in its "trigger" position such that the wiper arms 106A, 106B and 106C each abut their associated a contact. Referring to FIG. 1*b*, a trigger signal from the equipment under test is brought in, preferably by an optical coupler which includes the semiconductor switching device 134 as an element thereof. The trigger signal is applied to the inverting input of the amplifier/limiter circuit 136 and, by virtue of the diode 142 connected in the feedback circuit thereof, a rectangular pulse-type output is provided to the comparator stage inluding the operational amplifier 148. The resistor 144 and capacitor 146 in the feedback loop of the operational amplifier 136 provide requisite shaping whereby the resulting output from the amplifier 136 will have a relatively square wave configuration.

Assuming that the output from the amplifier 136 is of a sufficient amplitude to exceed the bias applied to the non-inverting input of the comparator 148 by way of the voltage divider including the source +V, the resistor 152 and the potentiometer 150, the comparator 148 will output a positive going pulse excursion which turns on the NPN transistor 176 and causing the trigger LED 180 to be illuminated. This positive going wave is also applied to a rising edge triggered monostable multivibrator 154 causing it to switch to its unstable state. The time during which this metastable condition prevails is determined by the setting of the phase control potentiometer 166 and the position of the "Delay Range" switch arm 158 relative to its associated contacts. Thus, the width of the pulse appearing at the $\overline{Q}$ output of the one-shot 154 is variable. This pulse is coupled by way of the conductor 170 and the switch arm 106A to the trigger input terminal of a further one-shot circuit 68. In that the one-shot circuit 68 is arranged to be triggered on a rising edge, and because the input thereto is obtained from the $\overline{Q}$ output of the one-shot 154, the one-shot 68 will not be triggered until the trailing edge of the output from the one-shot 154. Thus, the instant of triggering of the one-shot 68 relative to the time of occurrence of the original input trigger signal at the input transistor 134 is also adjustable by the potentiometer 166 and the positioning of the Delay Range switch 158.

The triggering of the one-shot circit 68 provides a positive pulse to the base electrode of the driver transistor 70 causing the junction point 74 to go positive for the duration of that output. When the one-shot circuit 68 reverts to its stable state following the delay interval determined by the time constant of the R-C circuitry associated with its $T_1$ and $T_2$ terminals, the resulting rising edge on the conductor 78 triggers the one-shot circuit 80, turning on the driver transistor 82 and causing an optical output signal to be generated from the LED diode connected in series with its collector electrode to provide a "TRIGGER OUT" indication. With driver transistor 82 conducting, the junction point 74 remains positive until the one-shot circuit 80 again reverts to its stable state.

The junction 74 can be considered as a dot OR of the pulses from the Q output of the one-shot circuit 68 and from the one-shot circuit 80. When junction 74 goes positive, the transistor 58 is turned on, a current flows from the DC source $+V_1$, through the LED 64 and through the conductor 60 to provide the requisite base current for causing the Darlington coupled transistors 40 and 42 to conduct. When junction 74 again goes negative at the conclusion of the output from the one-shot 80, the transistor 58 turns off and so does the Darlington pair 24. The cessation of conduction of current through the primary winding 20 of the induction coil 16 then induces a substantial voltage across the spark gap 10–12 causing a voltage breakdown (spark) and a resulting emission of a noise burst pulse. In that the magnitude of the voltage developed across the secondary winding 14 is determined by the rate of change of current through the primary winding 20, the power output from the spark discharge is determinable by the setting of the R-C parameters associated with the one-shot circuit 68. That is to say, the positioning of the potentiometer 94 effectively controls the length of the pulse output from the one-shot circuit 68 and if this pulse interval is quite short, the magnitude of the current flowing through the primary winding 20 at the time of turn-off of the Darlington pair 24 is low. As a result, the magnitude of the voltage developed across the spark gap will be reduced.

When the mode control switch 106 is moved to the "single" position such that the switch arms 106A, 106B and 106C each abut their associated b contact, the depression of the push button switch 122 will be the event which causes a positive going edge to be applied to the one-shot circuit 68. Initially, following depression of the switch 122, the semiconductor switch 24 will conduct for a preset interval, typically twenty seconds, and then cease conduction to create the inductive kick needed to generate the spark discharge. A trigger signal usually occurs prior to the end of the twenty-second interval to turn off the one-shot 68 and fire the spark. However, if no such trigger signal occurs the firing at the end of the twenty-second interval interrupts the coil current to preserve battery life. Any outputs from the comparator 148 occasioned by the occurrence of triggering pulses from the equipment under test are inverted by the circuit 172 and the resulting low signal, when applied to the reset terminal of the one-shot circuit 68 will hold the circuit reset and preclude repeated firings of the spark discharge.

When the mode-control switch 106 is set to the "Manual" mode with the switch arms 106A, 106B and 106C each abutting their associated c contact, the semiconductor switching device 24 will remain conducting except for a predetermined interval following the depression of the fire/arm switch 122. Thus, depression of the switch 122, acting through the one-shots 68 and 80, create the requisite impulse pattern for generating the spark discharge across the electrodes 12 and 10. The operation, when in the manual mode, differs from that in the single-shot mode in that in the single-shot mode a time interval is developed during which the current flow through the primary winding 20 is allowed to reach a steady state prior to the turning off of the Darlington coupled control transistors 24. In the manual mode, however, the Darlington pair 24 is normally continuously conducting in anticipation of the depression of the fire/arm switch 122 which, of course, creates a continuous drain on the battery. However, the creation of the noise burst is generally instantaneous with the closure of the switch 122 rather than after a preset time delay, e.g., 20 seconds.

In the free-running mode, the mode-control switch 106 is set such that the respective switch arms 106A, 106B and 106C each abut their associated d contact. This action causes the voltage controlled oscillator 110 to be coupled to the trigger input of the one-shot circuit 68. By properly setting the control knobs 112, 116 and 118 associated with the VCO 110, the burst rate of the generated noise pulses can be controlled. Typically, and for exemplary purposes only, the firing rate of the spark discharge can be continuously adjusted from close to 0 Hz to about 1 KHz. Those skilled in the art can readily discern from the description previously presented relating to the triggering mode how the output from the VCO 110 can be made to operate through the one-shot timing circuits 68 and 80 to control the interruption of the current flowing through the primary winding 20 of the induction coil 16.

In designing the noise generator of the present invention, a rechargeable battery 32 was selected as the energy source rather than using a rectified and filtered 60 cycle AC source. The reason for this is that if the instrument were to be plugged into a building's normal 60 cycle supply, noise would travel through its line cord, into the power grid, and then into the instrument under test. It is, of course, important to be able to separate the radiated noise produced by the noise generator of the present invention from all other types of noise. Using the scheme of the present invention, this eliminates the possibility of noise pulses being conducted through the building's supply to the equipment under test and, hence, the only noise impacting the equipment being tested is that radiated from the noise generator of the present invention.

The invention has been described herein in considerable detail, in order to comply with the patent statutes and to provide those skilled in the art with the information needed to apply the novel principles, and to construct and use such specialized components as are required. However, it is to be understood that the invention can be carried out by specifically different equipment and devices, and that various modifications, both as to equipment details and operating procedures can be effected without departing from the scope of the invention itself.

What is claimed is:

1. Electrical noise generating apparatus comprising:
   (a) a source of direct current voltage;
   (b) spark discharge means connected to be energized by said source of direct current voltage;
   (c) semiconductor switching means disposed between said source and said spark discharge means for selectively interrupting current flow therethrough;
   (d) control means including triggerable timing means coupled to said semiconductor switching means for selectively determining which of a plurality of events will operate said semiconductor switching means;
   (e) manually operable, multi-position switch means having a pole thereof coupled to said triggerable timing means for determining which of said plurality of events will trigger said triggerable timing means; and
   (f) a variable frequency oscillator coupled to one position of said multi-position switch means for causing said triggerable timing means to be repetitively triggered at a predetermined rate.

2. Apparatus as in claim 1 and further including further manually operable switch means coupled to one position of said multi-position switch means for causing said triggerable timing means to be triggered once for each operation of said further manually operable switch means.

3. Apparatus as in claim 1 and further including an input means for receiving actuation signals from an external device, signal conditioning means coupled between said input means and one position of said multi-position switch means for causing said triggerable timing means to be triggered as a result of said actuation signals.

4. Apparatus as in claim 3 wherein said signal conditioning means comprises phase adjusting means for selectively adjusting a delay interval between the occurrence of said actuation signals and the triggering of said triggerable timing means.

5. Apparatus as in claim 1 wherein said triggerable timing means includes means for determining the time that the output of said triggerable timing means is in a predetermined state whereby the power dissipated during the operation of said spark discharge means is controlled.

6. Apparatus as in claim 1 wherein said spark discharge means comprises:
   (a) an induction coil having a pirmary winding and a secondary winding;
   (b) said primary winding being connected in series with said source of direct current voltage and said semiconductor switching means; and
   (c) a pair of electrodes spaced from one another by a predetermined gap dimension and across said secondary winding.

7. Apparatus as in claim 3 wherein said input means comprises a fiber-optic coupler.

* * * * *